(12) United States Patent
Park et al.

(10) Patent No.: US 10,854,701 B2
(45) Date of Patent: *Dec. 1, 2020

(54) DISPLAY DEVICE INCLUDING A FLEXIBLE SUBSTRATE

(71) Applicant: SAMSUNG DISPLAY CO., LTD., Yongin-si (KR)

(72) Inventors: Hyun Ae Park, Cheonan-si (KR); Sun-Ja Kwon, Gunpo-si (KR); Byung Sun Kim, Hwaseong-si (KR); Yang Wan Kim, Hwaseong-si (KR); Su Jin Lee, Seoul (KR); Jae Yong Lee, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/230,726

(22) Filed: Dec. 21, 2018

(65) Prior Publication Data
US 2019/0123128 A1 Apr. 25, 2019

Related U.S. Application Data

(63) Continuation of application No. 15/617,025, filed on Jun. 8, 2017, now Pat. No. 10,163,999.

(30) Foreign Application Priority Data

Jun. 8, 2016 (KR) .................. 10-2016-0070857

(51) Int. Cl.
H01L 33/00 (2010.01)
H01L 27/32 (2006.01)
(Continued)

(52) U.S. Cl.
CPC ....... H01L 27/3276 (2013.01); G09G 3/3233 (2013.01); H01L 27/3262 (2013.01);
(Continued)

(58) Field of Classification Search
None
See application file for complete search history.

(56) References Cited

U.S. PATENT DOCUMENTS 10,163,999 B2 * 12/2018 Park .................. H01L 27/3276
2013/0089954 A1 4/2013 Ro et al.
(Continued)

FOREIGN PATENT DOCUMENTS

KR 10-2011-0049094 5/2011
KR 10-2015-0001019 1/2015

Primary Examiner — Reema Patel
(74) Attorney, Agent, or Firm — F. Chau & Associates, LLC

(57) ABSTRACT

A display device includes a substrate including a display area and a peripheral area disposed around the display area. The peripheral area, includes a bending region and a contact region adjacent to the bending region. A first connection line includes a first portion disposed in the contact region, and a second portion disposed in both the bending region and the contact region, and including a first layer and a second layer. At least part of the second layer of the second portion overlaps the first layer of the second portion. In the contact region, the first layer of the second portion is electrically connected to the first portion, and the second layer of the second portion is electrically connected to the first layer of the second portion.

20 Claims, 10 Drawing Sheets

(51) Int. Cl.
*G09G 3/3233* (2016.01)
*H01L 51/00* (2006.01)
*H01L 29/45* (2006.01)
*H01L 29/49* (2006.01)
*H01L 49/02* (2006.01)
*H01L 27/12* (2006.01)
*H01L 51/52* (2006.01)

(52) U.S. Cl.
CPC ...... *H01L 27/3265* (2013.01); *H01L 51/0097* (2013.01); *G09G 2300/0861* (2013.01); *G09G 2310/0251* (2013.01); *G09G 2310/0262* (2013.01); *G09G 2320/043* (2013.01); *H01L 27/124* (2013.01); *H01L 27/1255* (2013.01); *H01L 28/60* (2013.01); *H01L 29/45* (2013.01); *H01L 29/4908* (2013.01); *H01L 51/52* (2013.01); *H01L 2251/5338* (2013.01); *Y02E 10/549* (2013.01)

(56) References Cited

U.S. PATENT DOCUMENTS

2014/0217397 A1    8/2014   Kwak et al.
2017/0358641 A1   12/2017   Park et al.

\* cited by examiner

DISPLAY DEVICE INCLUDING A FLEXIBLE SUBSTRATE

CROSS-REFERENCE TO RELATED APPLICATION

This application is a Continuation of U.S. patent application Ser. No. 15/617,025, filed on Jun. 8, 2017, which claims priority to and the benefit of Korean Patent Application No. 10-2016-0070857, filed in the Korean Intellectual Property Office on Jun. 8, 2016, the entire contents of which are herein incorporated by reference.

TECHNICAL FIELD

The present disclosure relates to a display device, and more particularly, to a display device including flexible substrate.

DISCUSSION OF THE RELATED ART

A display device, such as an organic light emitting diode (OLED) display device or a liquid crystal display (LCD), is commonly used. The display device includes a display panel. The display panel includes a plurality of pixels for displaying an image. The display panel includes various signal lines for transmitting signals to each pixel.

The display panel is manufactured by forming several layers and elements on a substrate. In general, glass is used as the substrate, however there is a drawback in that the glass substrate is heavy and is easily broken. Also, the glass substrate is rigid such that it is difficult to bend or otherwise deform the display panel. Recently, a display panel using a flexible substrate has been developed. The flexible substrates are more resilient to impact and can be effectively bent or otherwise deformed.

Most display panels will have a non-display region around the periphery in which no image is displayed. The non-display region generally includes contact pads for receiving the signals that are to be transmitted to the pixels. The display device using the flexible substrate may be designed, for example, to bend at the periphery, near the pad portion, to reduce the perceivable size of the non-display region, and to make the displayed image appear to be closer to the edges of the display device.

However, as the signal lines disposed on the non-display region are bent, they may become stretched. The length of these lines may thereby be increased and their cross-sectional area reduced. This may serve to increase resistance through the bent lines, increase a current density, and drop the voltage of the lines, thereby deteriorating display quality and/or increasing power consumption of the display device.

SUMMARY

A display device includes a substrate including a display area and a peripheral area disposed around the display area. The peripheral area includes a bending region and a contact region adjacent to the bending region. A first connection line includes a first portion disposed in the contact region, and a second portion disposed in both the bending region and the contact region, and including a first layer and a second layer. At least part of the second layer of the second portion overlaps the first layer of the second portion. In the contact region, the first layer of the second portion is electrically connected to the first portion, and the second layer of the second portion is electrically connected to the first layer of the second portion.

A display device includes a substrate having a display area and a non-display area. The non-display area includes a bending region. A connection line, for driving the display device, is connected to the display area and runs across the bending region of the non-display area. The connection line, within at least the bending region of the non-display area, includes a first layer and a second layer in contact with each other at a plurality of contact points, and otherwise separated from each other by an insulation layer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
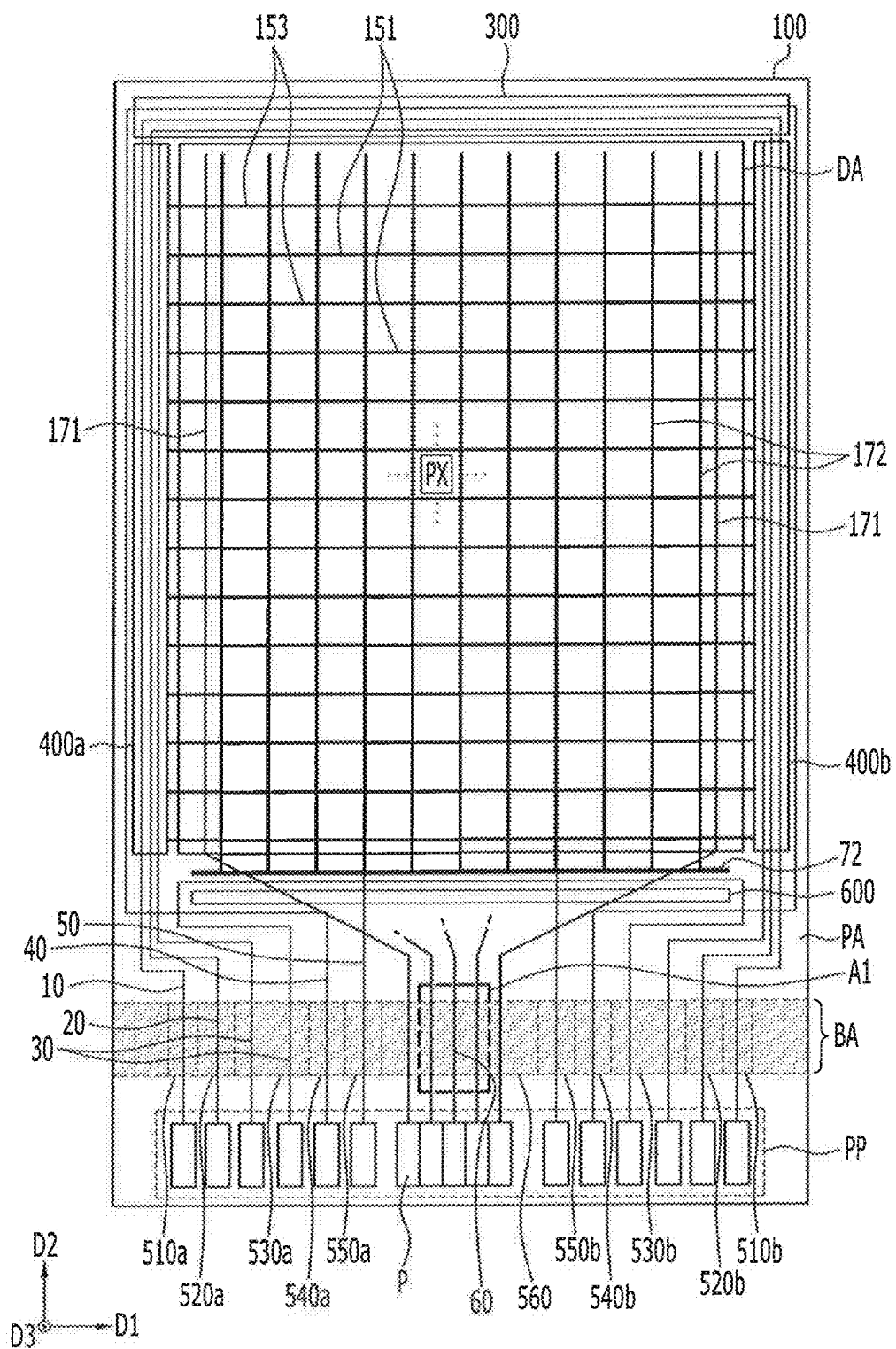
FIG. 1 is a layout view illustrating a display device according to an exemplary embodiment of the present invention.

Hereinafter, the present invention will be described more fully with reference to the accompanying drawings, in which exemplary embodiments of the invention are shown. As those skilled in the art would realize, the described embodiments may be modified in various different ways, all without departing from the spirit or scope of the present invention.

Elements that are similar or identical to corresponding elements may be referred to with the same reference numerals throughout the specification and disclosure.

In the drawings, the size and/or thickness of layers, films, panels, regions, etc., may be exaggerated for clarity.

It will be understood that when an element such as a layer, film, region, or substrate is referred to as being "on" another element, it can be directly on the other element or intervening elements may also be present. Further, in the specification, the word "on" or "above" means disposed on or below the object portion, and does not necessarily mean disposed on the upper side of the object portion based on a gravitational direction.

A display device according to an, exemplary embodiment of the present invention will now be described with reference to accompanying drawings. Even though an organic light emitting diode (OLED) device is described as the display device, the present invention is not limited to the OLED device, and may be applied to all display devices that have a bending region.

FIG. 1 is a layout view illustrating a display device according to an exemplary embodiment of the present invention.

Referring to FIG. 1, a display device according to an exemplary embodiment of the present invention includes a display panel 100. The display panel 100 includes a display area DA within which an image is displayed, and a peripheral area PA, in which an image is not displayed. The peripheral area PA may surround the display area DA. The peripheral area PA may include various elements and/or signal lines that are used to generate and/or transmit various signals applied to the display area DA.

In the display area DA of the display panel 100, pixels PX may be disposed in a matrix. In the display area DA, signal lines such as gate lines 151, light emission control lines 153, data lines 171, and driving voltage lines 172 are also disposed. The gate lines 151 and the light emission control lines 153 may extend primarily in a first direction D1 (e.g., a row direction), and the data lines 171 and the driving voltage lines 172 may each extend primarily in a second direction D2 (e.g., a column direction) crossing the first direction D1. Each pixel PX is connected to the gate line 151, the light emission control line 153, the data line 171, and the driving voltage line 172, such that each pixel PX may be applied with a gate signal, a light emission control signal, a data voltage, and a driving voltage from these signal lines.

In the peripheral area PA of the display panel 100, a pad portion PP to receive the signals from an external source is disposed. A printed circuit film may be attached to the pad portion PP, and bumps of the printed circuit film may be electrically connected to pads P of the pad portion PP.

In the peripheral area PA of the display panel 100, a driving element is formed. The driving element may be used to generate and/or process various signals used to drive the display panel 100. The driving element includes gate drivers 400a and 400b. The gate drivers 400a and 400b apply a gate signal to the gate lines 151. The driving element further includes light emission control lines 153 for providing a light emission control signal, a data driver for applying a data signal to the data lines 171, and a signal controller for controlling the gate driver 400a and 400b and the data driver.

The gate drivers 400a and 400b may be integrated with the display panel 100. The gate drivers 400a and 400b may include a first gate driver 400a and a second gate driver 400b, respectively disposed at a right side and a left side of the display area DA. Alternatively, the gate driver may be disposed at either the right or the left side of the display area DA, or may be electrically connected to the display panel 100 as a tape carrier package (TCP).

The data driver and the signal controller may be provided as a driving circuit chip. The driving circuit chip may be mounted to the display panel 100 as an integrated circuit (IC) chip, or may be electrically connected to the display panel 100 as a tape carrier package (TCP). The data driver and the signal controller may be formed as one chip or as separate chips.

A lighting circuit portion 300 and a data input circuit portion 600 may be further disposed in the peripheral area of the display panel 100. The lighting circuit portion 300 may be disposed, for example, at the upper side of the display area DA. The lighting circuit portion 300 may include transistors, and may detect the presence of a crack within the display panel 100. The data input circuit portion 600 may be disposed at the lower side of the display area DA, for example. The data input circuit portion 600 may include a demultiplexer circuit connected to the data lines 171 of the display area DA.

The display panel 100 includes a bending region BA. The bending region BA, for example, may be disposed at the peripheral area PA between the display area DA and the pad portion PP. The bending region BA extends across the display panel 100 in the first direction D1. The display panel 100 is bent in the bending region BA such that the pad portion PP is separated from the display area DA by the bending region BA.

The signal lines may extend into the peripheral area PA. The parts of the signal lines extending into the bending region BA include a data signal line group 560, a first group 510a, a second group 520a, a third group 530a, a fourth group 540a, and a fifth group 550a. The parts of the signal lines extending into the bending region BA are separated from each other primarily in the first direction D1 and extend primarily in the second direction D2.

The data signal line group 560 includes data signal lines 60 transmitting a data signal to the data line 171. The data signal line group 560 may be disposed at the approximate center of the bending region BA.

The first group 510a, the second group 520a, the third group 530a, the fourth group 540a, and the fifth group 550a are adjacent to each other in the bending region BA. The first to fifth groups 510a, 520a, 530a, 540a, and 550a may be disposed at the left side of the data signal line group 560, and the fifth group 550a may be closest to the data signal line group 560. The order of arrangement of the first to fifth groups 510a, 520a, 530a, 540a, and 550a may be different from what is shown.

The first group 510a incudes at least one first signal line 10, the second group 520a includes at least one second signal line 20, and the third group 530a includes at least one third signal line 30. In the bending, region BA, first to fifth additional groups 510b, 520b, 530b, 540b, and 550b may be disposed at the right side of the data signal line group 560. The first to fifth additional groups 510b, 520b, 530b, 540b, and 550b may be disposed symmetrically with the first to fifth groups 510a, 520a, 530a, 540a, and 550a with respect to the data signal line group 560. The characteristics of the first to fifth additional groups 510b, 520b, 530b, 540b, and 550b may be substantially the same as the characteristics of the first to fifth groups 510a, 520a, 530a, 540a, and 550a, and accordingly, the detailed description of the first to fifth additional groups 510b, 520b, 530b, 540b, and 550b may be the same as the description of the first to fifth groups 510a, 520a, 530a, 540a, and 550a.

The first signal line 10 of the first group 510a may transmit a signal of a first polarity, the second signal line 20 of the second group 520a may transmit a signal of a second polarity, and the third signal line 30 of the third group 530a may transmit a signal of a third polarity. The polarity of the signals may include a positive polarity (+) and a negative polarity (−). The positive polarity (+) is a polarity such that a voltage level of the signal is larger than a reference voltage, such as a ground voltage. The negative polarity (−) is a polarity such that the voltage level of the signal is smaller than the reference voltage.

The first polarity, the second polarity, and the third polarity are different from each other. For example, the signal of the first polarity may be the positive polarity (+) that is constant over time. The signal of the second polarity may be the negative polarity (−) that is constant over time. The signal of the third polarity may periodically or aperiodically swing between the positive polarity (+) and the negative polarity (−). The signal of the first polarity and the signal of the second polarity may be signals of a constant voltage, and the signal of the third polarity may be a signal having a periodical pulse, for example, a clock signal.

According to an exemplary embodiment of the present invention, if the signal lines 10, 20, and 30 transmitting the signals of the same polarity are arranged as described above, a voltage difference of the signals transmitted by the signal lines 10, 20, and 30 adjacent in one group 510*a*, 520*a*, and 530*a* may be minimized. This may reduce the chances of signal lines 10, 20, and 30, that are adjacent to each other, transmitting signals of different polarities. This may effectively prevent corrosion of the parts of the signal lines disposed in the bending region BA. To the extent that there are signal lines 10, 20, and 30 that are adjacent to each other and carry signals of the same polarity, the distance for which this is the case may be minimized or a strong electric field may be generated between the adjacent signal lines 10, 20, and 30. These strong electric fields may cause charge to move between the adjacent signal lines 10, 20, and 30, thereby corroding the signal lines 10, 20, and 30.

The first signal line 10 of the first group 510*a* may include, for example, a signal line transmitting a common voltage ELVSS, a signal line transmitting a gate low voltage VGL, and a signal line transmitting an initialization voltage Vint.

The signal line transmitting the common voltage ELVSS may extend to enclose the left side, the upper side, and the right side of the display area DA. The signal line transmitting the common voltage ELVSS may function as a guard ring. The signal line transmitting the gate low voltage VGL is connected to the gate drivers 400*a* and 400*b* and may be used to generate a low voltage level of the gate signal in the gate drivers 400*a* and 400*b*. The signal line transmitting the initialization voltage Vint is connected to an initialization voltage transmitting line disposed in the display area DA to transmit the initialization voltage Vint. The initialization voltage Vint may be used to drive the pixel PX.

The second signal line 20 of the second group 520*a*, for example, may include a signal line transmitting RGB constant voltages DC_R, DC_G, and DC_B, a signal line transmitting a gate constant voltage DC_GATE, a signal line transmitting a gate high voltage VGH, and a signal line transmitting a sensing voltage MCD.

The signal line transmitting the RGB constant voltages DC_R, DC_G, and DC_B is connected to the lighting circuit portion 300, and may transmit the RGB constant voltages DC_R, DC_G, and DC_B to an input terminal of the transistor included in the lighting circuit portion 300. The signal line transmitting the gate constant voltage DC_GATE is connected to the lighting circuit portion 300, and may transmit the gate constant voltage DC_GATE to a control terminal of the transistor included in the lighting circuit portion 300. The signal line transmitting the gate high voltage VGH may be connected to the gate drivers 400*a* and 400*b*. The gate high voltage VGH may be used to generate a high voltage for the gate signal.

The third signal line 30 of the third group 530*a* may include, for example, a signal line transmitting light emission clock signals EMCLK1 and EMCLK2, a signal line transmitting a light emission frame signal ACLFLM, a signal line transmitting clock signals CLK1 and CLK2, a signal line transmitting a frame signal FLM2, and a signal line transmitting data control signals CLA, CLB, and CLC.

The signal line transmitting the light emission clock signals EMCLK1 and EMCLK2 may be connected to the gate drivers 400*a* and 400*b* to provide the light emission block signals EMCLK1 and EMCLK2 to a circuit for generating the light emission control signals of the gate drivers 400*a* and 400*b*. The signal line transmitting the light emission frame signal ACLFLM is connected to the gate drivers 400*a* and 400*b* to direct the start of one frame for imputing the light emission control signal to the display area DA. The signal line transmitting the clock signals CLK1 and CLK2 may be connected to the gate drivers 400*a* and 400*b* to provide clock signals CLK1 and CLK2 to the circuit for generating the gate signal. The signal line transmitting the frame signal FLM2 may be connected to the gate drivers 400*a* and 400*b* to direct the start of one frame for inputting the gate signal to the display area DA. The signal line transmitting the data control signals CLA, CLB, and CLC may be connected to the data input circuit portion 600 to transmit the data control signals CLA, CLB, and CLC to the gate terminal of the transistor included in the data input circuit portion 600.

The fourth group 540*a* includes a fourth signal line 40 and the fifth group 550*a* includes a fifth signal line 50. The fourth signal line 40 may transmit the voltage of the constant polarity such as the common voltage ELVSS. The common voltage ELVSS may be the constant voltage of the negative polarity (−). The fifth signal line 50 may transmit a signal that is different from that of the fourth signal line 40, for example, the voltage of the constant polarity such as a driving voltage ELVDD. The driving voltage ELVDD may be the constant voltage of the positive polarity (+). The fifth signal line 50 may be connected to a driving voltage transmitting line 72 connected to the driving voltage line 172 of the display area DA.

The signal lines including the pan disposed at the bending region BA may be grouped into the first to fifth groups 510*a*, 520*a*, 530*a*, 540*a*, and 550*a* and the first to fifth additional groups 510*b*, 520*b*, 530*b*, 540*b*, and 550*b*, as described above. However, the present invention is not limited to this particular arrangement, and the signal lines may be alternatively grouped. Also, depending on the design of the display device, the part among the above-described signal lines might be omitted and signal lines transmitting the signal or the voltage of the different polarities may be further included.

Thus far, the overall structure of the display device has been described. Next, the area around the bending region of the display device will be described in detail.

Figure 2:
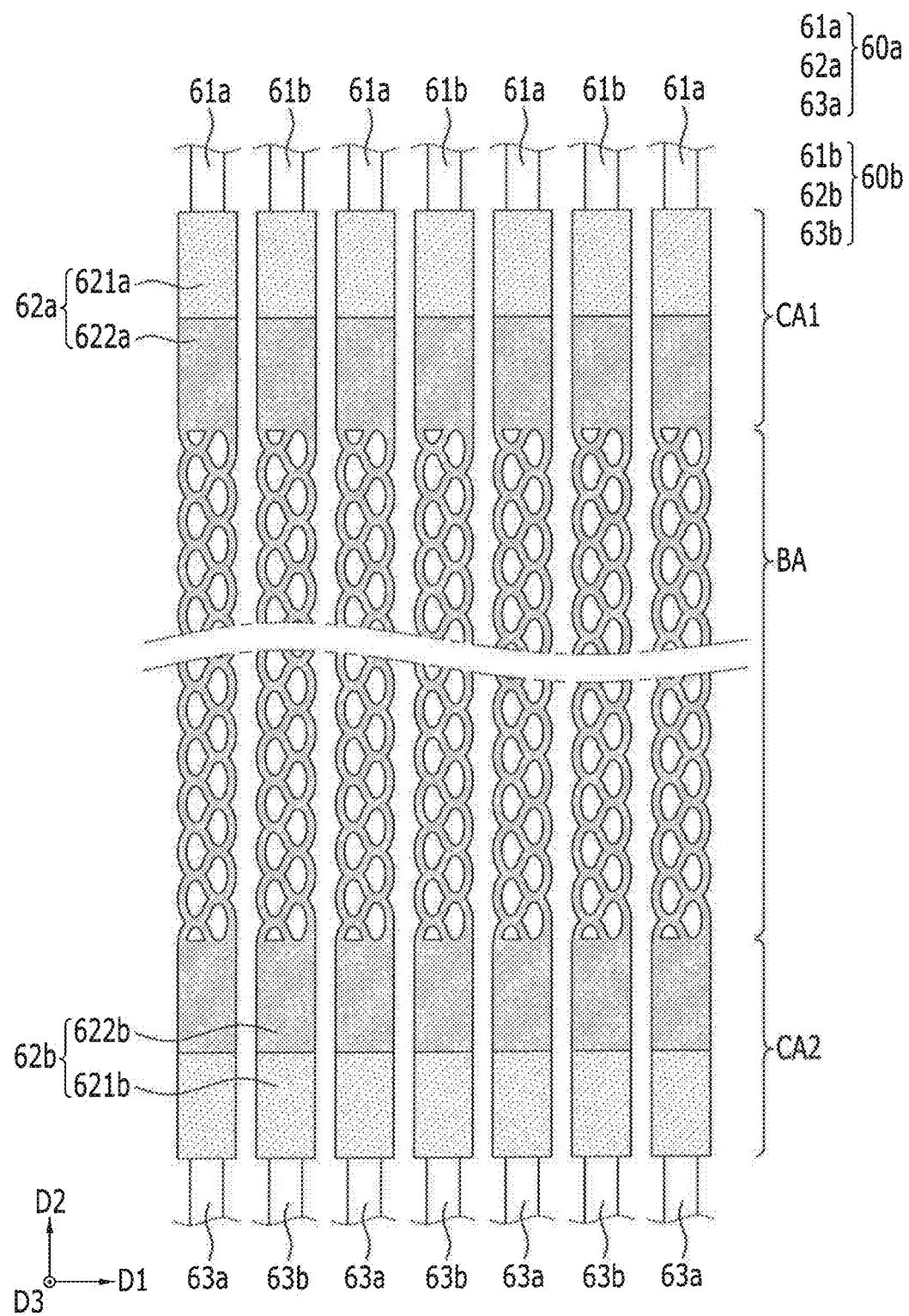
FIG. 2 is an enlarged view illustrating a region A1 of FIG. 1.
Figure 3:
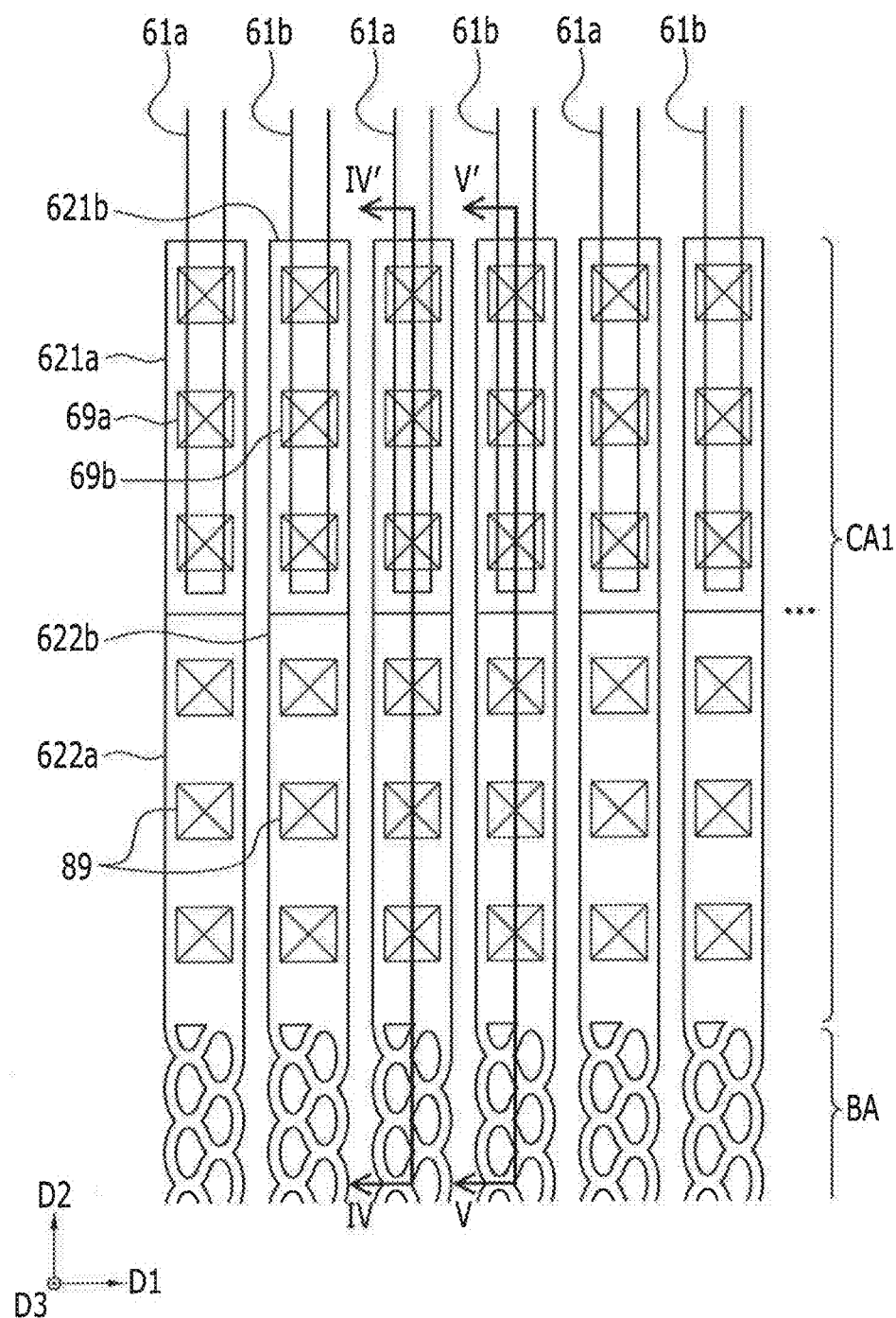
FIG. 3 is an enlarged view illustrating a first contact region of FIG. 2.
Figure 4:
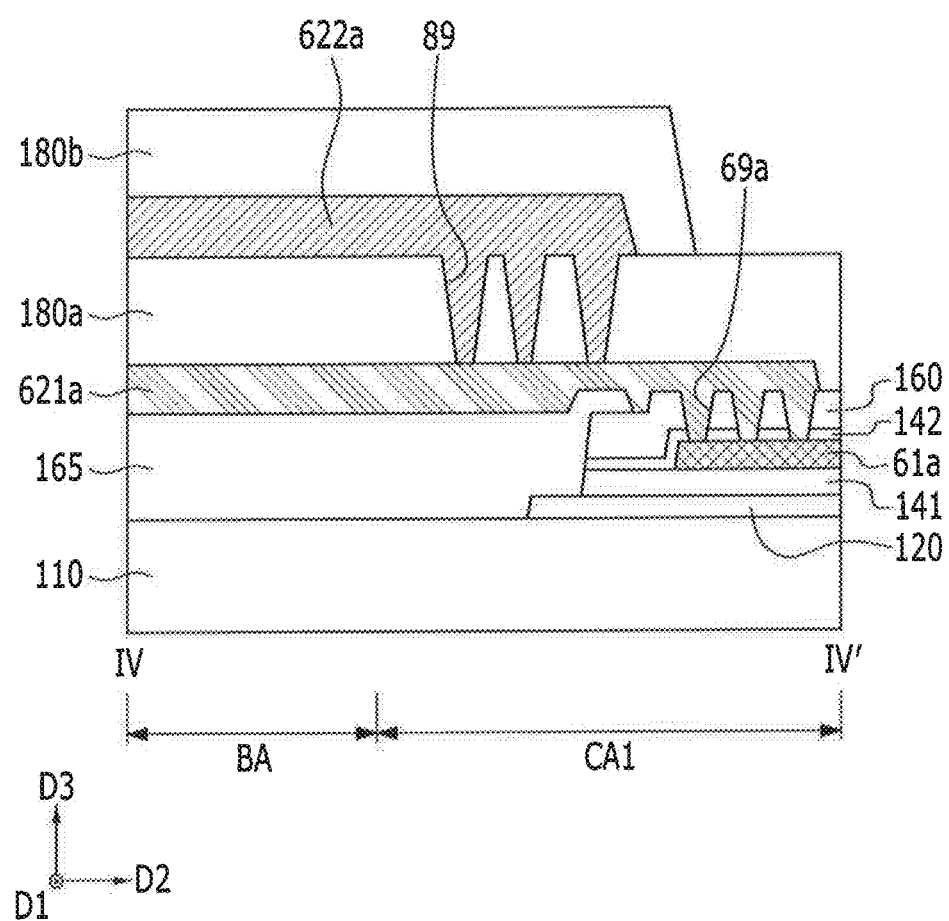
FIG. 4 is a cross-sectional view taken along a line IV-IV' in FIG. 3.
Figure 5:
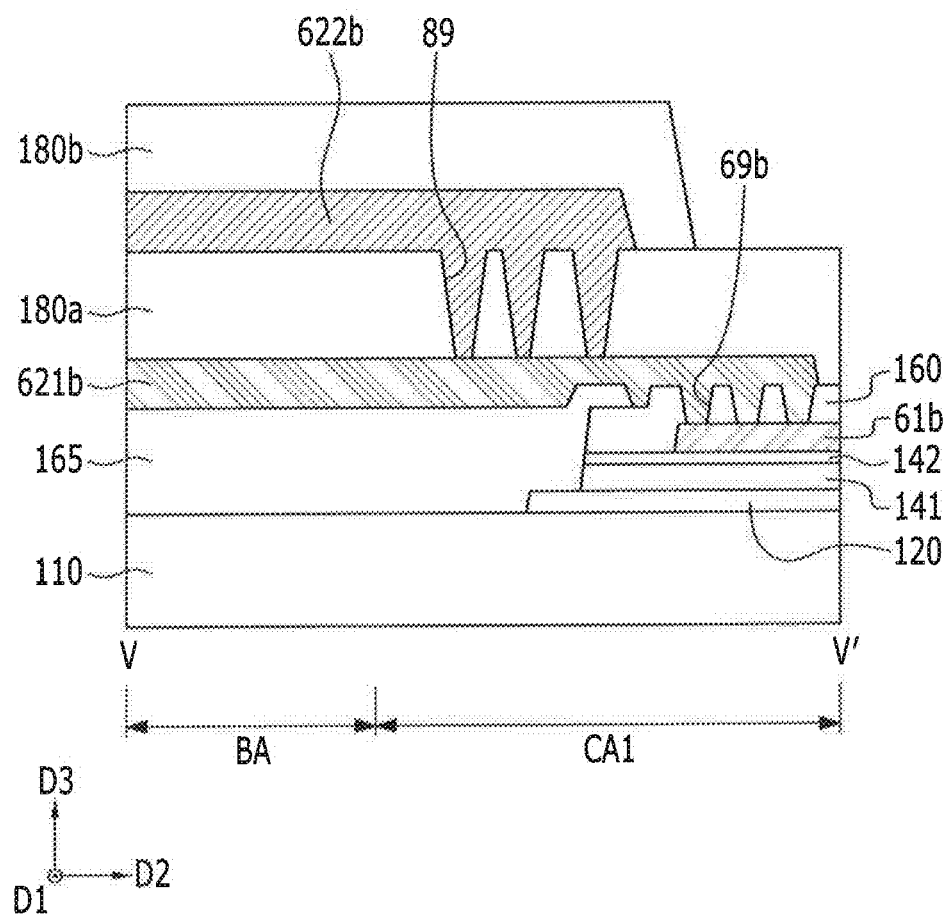
FIG. 5 is a cross-sectional view taken along a line V-V' in FIG. 3.

FIG. 2 is an enlarged view illustrating a region A1 of FIG. 1, FIG. 3 is an enlarged view of a first contact region of FIG. 2, FIG. 4 is a cross-sectional view taken along a line IV-IV′ in FIG. 3, and FIG. 5 is a cross-sectional view taken along a line V-V′ in FIG. 3.

FIG. 2 shows the parts of the signal lines disposed in the first and second contact regions CA1 and CA2 of the upper side and the lower side of the bending region BA, and the bending region BA. These signal lines may be the data signal lines 60 shown in FIG. 1 and may be the first to fifth signal lines 10, 20, 30, 40, and 50. The part of the signal line disposed at the bending region BA and the contact regions CA1 and CA2 is referred to as a connection line.

The connection line includes first connection lines 60a and second connection lines 60b. The first connection lines 60a and the second connection lines 60b may be alternately arranged in the first direction.

The first connection line 60a includes a first portion 61a, a second portion 62a, and a third portion 63a. The first portion 61a extends from the first contact region CA1 to the upper side of the first contact region CA1 (in the direction D2). The third portion 63a extends from the second contact region CA2 to the lower side of the second contact region CA2 (in the opposite direction to D2). The first portion 61a may extend from the peripheral area PA of the display panel 100 and may connect with the element transmitting the above-described signals. The third portion 63a may be connected to a pad P of the pad portion PP. The second portion 62a is disposed throughout the first contact region CA, the bending region BA, and the second contact region CA. In the first contact region CA1, one end of the second portion 62a is connected to the first portion 61a, and in the second contact region CA2, the other end of the second portion 62a is connected to the third portion 63a.

The second portion 62a disposed in the bending region BA may have a mesh shape including openings as described herein. However, the present invention is not limited to this particular arrangement. For example, the second portion 62a may have various other plane shapes within the bending region to increase flexibility during the bending. One such shape may be a serpentine shape. The shape of the second portion 62a disposed in the first and second contact regions CA1 and CA2 may be a flat plate such as a rectangle without an opening. The second portion 62a may be termed of an aluminum-based metal having a small modulus such as aluminum or an aluminum alloy. Thus, the second portion 62a has small stress against a strain such that a risk of disconnection or degradation may be reduced during the bending of the bending region BA.

The second portion 62a has a dual layer structure. For example, the second portion 62a includes both a first layer 621a and a second layer 622a. The first and second layers 621a and 621b may overlap and may be separated from each other by an insulating layer. The first layer 621a and the second layer 622a may completely overlap each other, as shown, or may only partially overlap one another. The first layer 621a and the second layer 622a may have the same planar shape or they may be differently shaped. The second layer 622a of the second portion 62a is connected to the first layer 621a of the second portion 62a in the first contact region CA1 and the second contact region CA2. The first layer 621a of the second portion 62a is connected to the first portion 61a in the first contact region CA1 and is connected to the third portion 63a in the second contact region CA2. In the bending region BA, the first layer 621a and the second layer 622a of the second portion 62a might not be connected to each other, but may instead extend in parallel to each other.

The resistance of the second portion 62a disposed in the bending region BA may be increased to increase the flexibility and to increase the length over which the bending occurs. As the second portion 62a may be formed of two layers 621a and 622a, resistance of the second portion 62a may be reduced. Also, even, if one of the two layers 621a and 622a of the second portion 62a of the first connection line 60a is disconnected, the other may continue to transmit the signal. Accordingly, the reliability of the signal transmitted through the first connection line 60a may be increased and a failure of the display panel 100 may decrease. Also, this arrangement may avoid the phenomenon by which the luminance of different light emission regions may be noticeably different.

The second connection line 60b includes a first portion 61b, a second portion 62b, and a third portion 63b and so is similar to the first connection line 60a. The first portion 61b extends to the upper side of the first contact region CA1 in the first contact region CA1 (in the direction D1) and the third portion 63b extends to the lower side of the second contact region CA2 in the second contact region CA2 (in the opposite direction to D1). The second portion 62b is disposed throughout the first contact region CA, the bending region BA, and the second contact region CA. In the first contact region CA1, one end of the second portion 62b is connected to the first portion 61b, while in the second contact region CA2, the other end of the second portion 62a is connected to the third portion 63b. The second portion 62b has the dual layered structure including a first layer 621b and a second layer 622b overlapping each other with the insulating layer disposed therebetween. The second layer 622b of the second portion 62b is connected to the first layer 621b of the second portion 62b in the first contact region CA1 and the second contact region CA2. The first layer 621b of the second portion 62b is connected to the first portion 61b in the first contact region CA1 and is connected to the third portion 63b in the second contact region CA2.

In the cross-sectional view of the display panel 100, the second connection line 60b has substantially the same configuration as the first connection line 60a, except for the layered arrangement of the first and third portions 61b and 63b that is different from the layered arrangement of the first and third portions 61a and 63a of the first connection line 60a. The deposition structure and the connection of the first and second connection lines 60a and 60b will be described in detail with reference to FIG. 3 to FIG. 5 while focusing on the first contact region CA1. The second contact region CA2 may have substantially the same structure as the first contact region CA1, and accordingly, the description of the second contact region CA2 is omitted.

FIG. 3 is an enlarged view of a first contact region of FIG. 2, FIG. 4 is a cross-sectional view taken along a line IV-IV' in FIG. 3, and FIG. 5 is a cross-sectional view taken along a line V-V' in FIG. 3.

FIG. 3 as the layout view in which the first connection line 60a and the second connection line 60b are alternately arranged in the first direction enlarges the first contact region CA1 of FIG. 2 to be clearly shown. FIG. 4 is a cross-sectional view related to the first connection line 60a, and FIG. 5 is a cross-sectional view related to the second connection line 60b.

Referring to FIG. 3 to FIG. 5, a buffer layer 120 and an insulating layer 141 are disposed on a substrate 110. The buffer layer 120 and the insulating layer 141, which may be primarily formed of an inorganic material, might not be disposed in the bending region BA. The buffer layer 120 and the insulating layer 141 may also be disposed in the region adjacent to the bending region BA in the first contact region CA1.

In the first contact region CA1, the first portion 61a of the first connection line 60a is disposed on the insulating layer 141. An insulating layer 142 is disposed on the first portion 61a of the first connection line 60a, and the first portion 61b of the second connection line 60b is disposed on the insulating layer 142. Accordingly, the first portion 61a of the first connection line 60a and the first portion 61b of the second connection line 60b are disposed on the different layers with the insulating layer 142 disposed therebetween. As described above, the first portion 61a of the first connection line 60a and the first portion 61b of the second connection line 60b are formed with the different layers, and they may be disposed to cross each other in the region (e.g., a fan-out region) except for the first contact region CA1, thereby increasing line density while maintaining line width. An insulating layer 160 is disposed on the first portion 61b of the second connection line 60b.

An insulating layer 165 is disposed on the substrate 110 in the bending region BA. The insulating layer 165 may be formed to cover the part of the insulating layer 160 disposed in the first contact region CA1. The insulating layer 165 may include the organic material to aid in the bending of the bending region BA.

The first layer 621a of the second portion 62a of the first connection line 60a and the first layer 621b of the second portion 62b of the second connection line 60b are disposed on the insulating layer 165 of the bending region BA and the insulating layer 160 of the first contact region CA1. The first layer 621a of the second, portion 62a of the first connection line 60a is connected to the first portion 61a of the first connection line 60a through contact holes 69a formed in the insulating layers 142 and 160 at the first contact region CA1. The first layer 621b of the second portion 62b of the second connection line 60b is connected to the first portion 61b of the second connection line 60b through contact holes 69b formed in the insulating layer 160 as the first contact region CA1.

An insulating layer 180a is formed on the first layer 621a of the second portion 62a of the first connection line 60a and the first layer 621b of the second portion 62b of the second connection line 60b. The second layer 622a of the second portion 62a of the connection line 60a and the second layer 622b of the second portion 62b of the second connection line 60b are disposed on the insulating layer 180a. In the first contact region CA1, the second layers 622a and 622b are connected to the first layers 621a and 621b through contact holes 89 formed in the insulating layer 180a. The insulating layer 180b may be disposed on the second layers 622a and 622b. The insulating layers 180a and 180b may include the organic material to aid in the bending of the bending region BA. Although not shown, at least one insulating layer including the organic material may be further disposed on the insulating layer 180b.

As described above, the first layers 621a and 621b of the first portion 61a of the first connection line 60a, the first portion 61b of the second connection line 60b, and the second portions 62a and 62b of the first and second connection lines 60a and 60b and the second layers 622a and 622b of the second portions 62a and 62b of the first and second connection lines 60a and 60b are disposed at different layers. The portions of the connection lines disposed at the different layers may be connected in the first contact region CA1. Also, in the second contact region CA2, like in the first contact region CA1, the portions of the connection lines may be connected.

As shown, the contact holes 69a and 69b and the contact holes 89 are not at all overlapped, however they may alternatively be disposed to be at least partially overlapped. The second layers 622a and 622b may be shorter than the first layers 621a and 621b in the second direction D2 (the length direction). However, the second layers 622a and 622b may alternatively have substantially the same length as the first layers 621a and 621b. In the drawing, although three contact holes 69a, 69b, and 89 are shown, there may be fewer or more contact holes formed. By forming the contact holes 69a, 69b, and 89 to be overlapped or reducing the number of the contact holes 69a, 69b, and 89, the size of the first contact region CA1 may be reduced.

The display device according to an exemplary embodiment of the present invention will be described with reference to FIG. 6 to FIG. 8.

Figure 6:
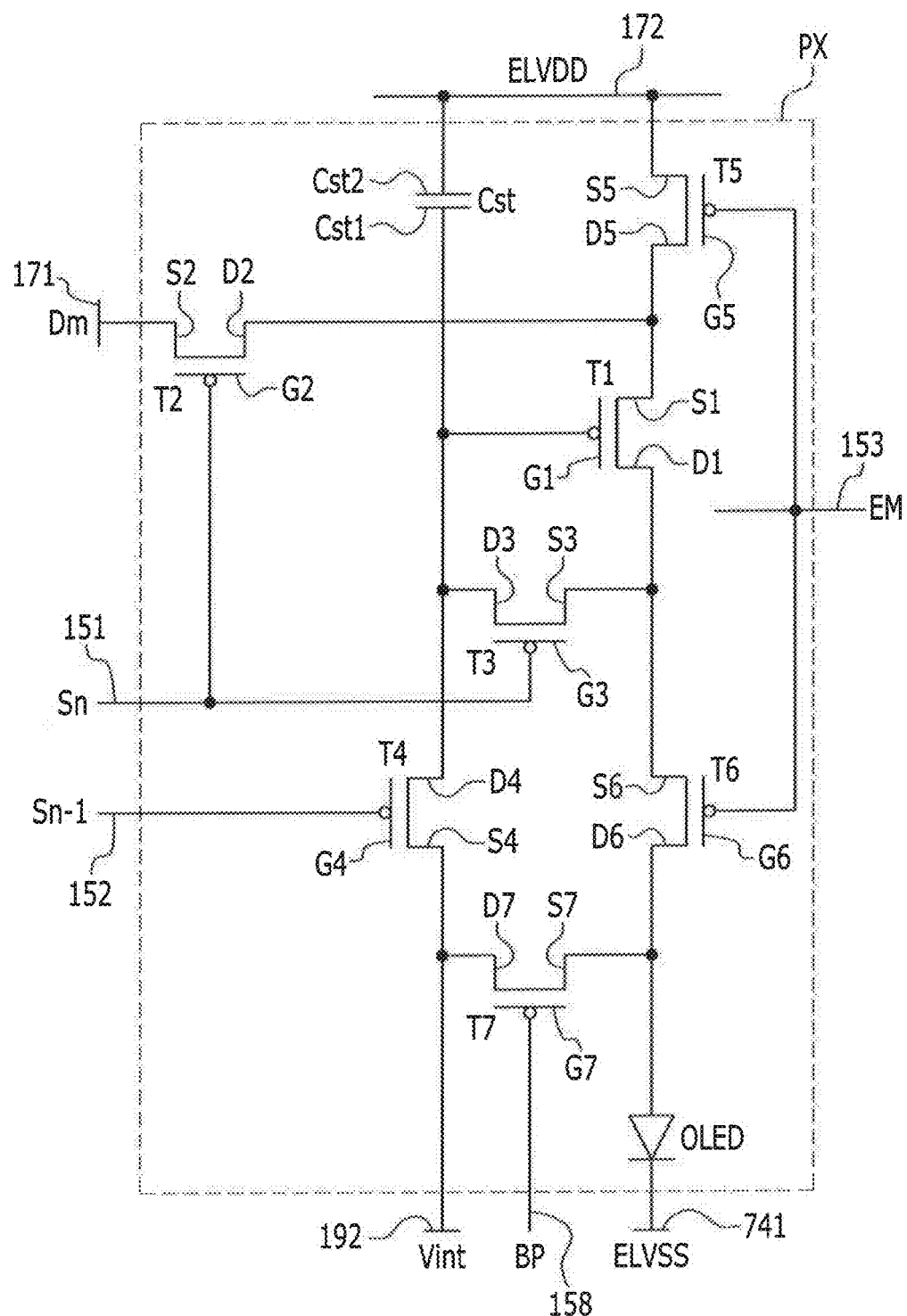
FIG. 6 is an equivalent circuit diagram illustrating one pixel of a display device according to an exemplary embodiment of the present invention.
Figure 7:
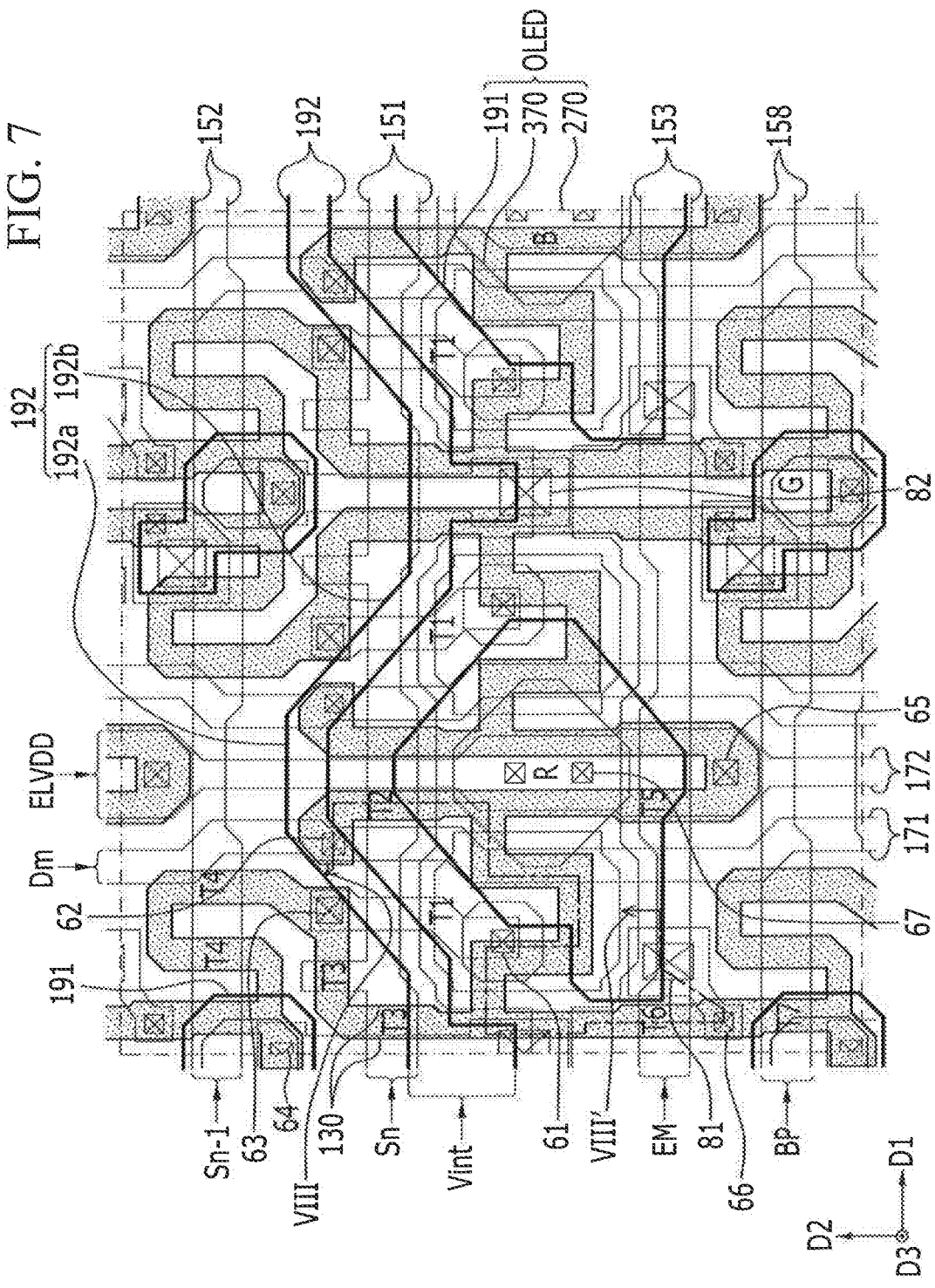
FIG. 7 is a layout view illustrating multiple pixels of a display device according to an exemplary embodiment of the present invention.
Figure 8:
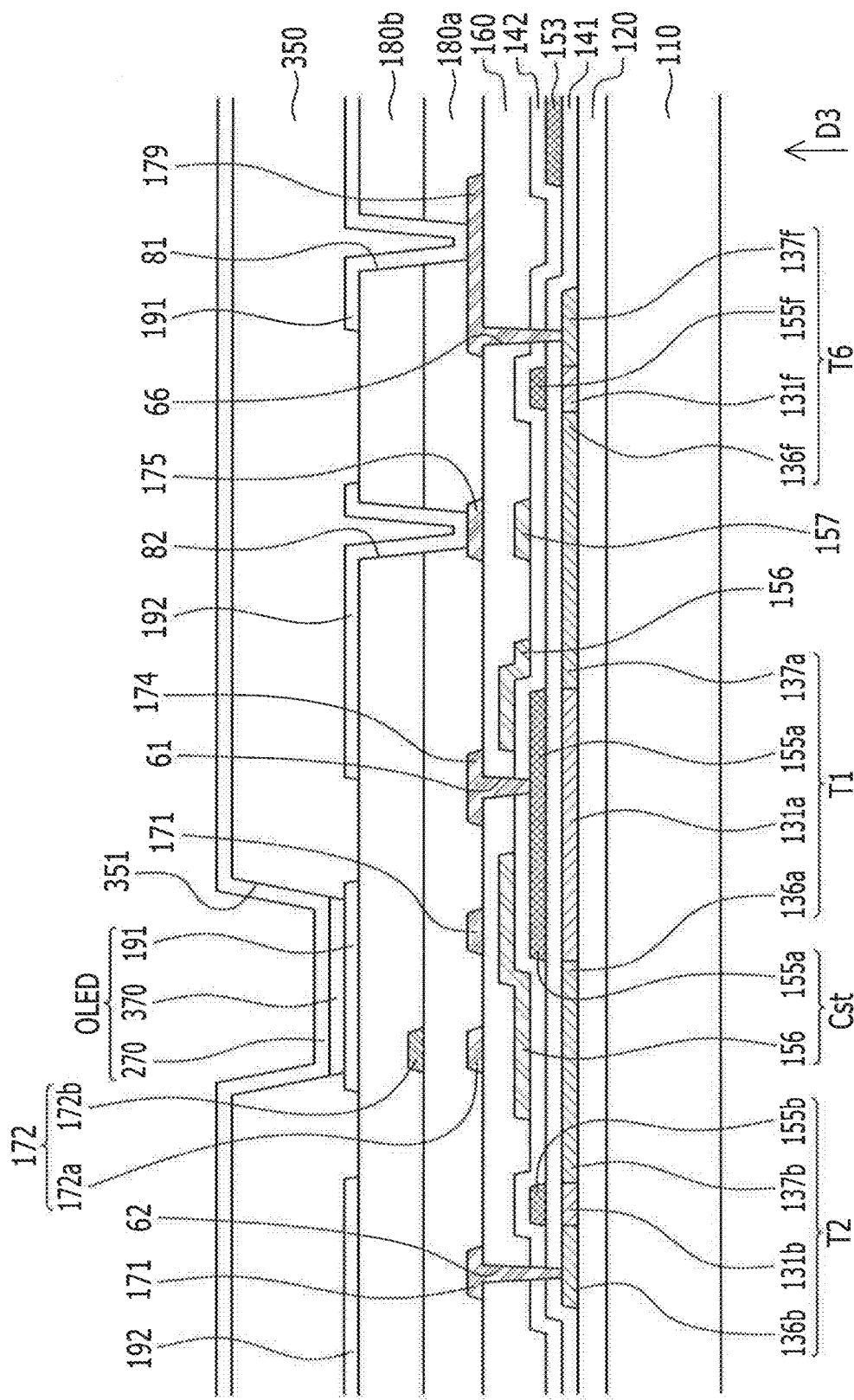
FIG. 8 is a cross-sectional view taken along a line VIII-VIII' in FIG. 7.

FIG. 6 is an equivalent circuit diagram illustrating one pixel of a display device according to an exemplary embodiment of the present invention, FIG. 7 is a layout view illustrating pixels of a display device according to an exemplary embodiment of the present invention, and FIG. 8 is a cross-sectional view taken along a line VIII-VIII' in FIG. 7.

Referring to FIG. 6, each pixel PX of the display area DA may include transistors T1, T2, T3, T4, 15, 16, and T7, a storage capacitor Cst, and an organic light emitting diode (OLED) connected to display signal lines 151, 152, 153, 158, 171, 172, and 192.

The transistors T1, T2, T3, T4, T5, T6, and T7 may include a driving transistor T1, a switching transistor T2, a compensation transistor T3, an initialization transistor T4, an operation control transistor T5, a light emission control transistor T6, and a bypass transistor T7.

The display signal lines 151, 152, 153, 158, 171, 172, and 192 may include a gate line 151, a previous gate line 152, a light emission control line 153, a bypass control line 158, a data line 171, a driving voltage line 172, and an initialization voltage line 192. The gate line 151 and the previous gate line 152 may be connected to the gate signal generating circuit of the aforementioned gate drivers 400a and 400b to respectively receive a gate signal Sn and a previous gate signal S(n−1), and the light emission control line 153 may be connected to the light emission control signal generating circuit of the gate drivers 400a and 400b to receive a light emission control signal EM.

The previous gate line 152 transmits the previous gate signal S(n−1) to the initialization transistor T4, the light emission control line 153 transmits the light emission control signal EM to the operation control transistor T5 and the light emission transistor T6, and the bypass control line 158 transmits the bypass signal BP to the bypass transistor T7.

The data line 171 may receive a data signal (Dm) through the data signal line group 560 and the data input circuit portion 600 that are described above, and the driving voltage line 172 may receive the driving voltage ELVDD through the fifth signal line 50 and the driving voltage transmitting line 72 of the above-described fifth group 550a. The initialization voltage line 192 may receive the initialization voltage Vint initializing the driving transistor T1 through the signal line transmitting the initialization voltage Vint of the above-described first group 510a.

The gate electrode G1 of the driving transistor T1 is connected to one end Cst1 of the storage capacitor Cst. The source electrode S1 driving transistor T1 is connected to the driving voltage line 172 via the operation control transistor T5. The drain electrode D1 of the driving transistor T1 is connected to an anode of the organic light emitting diode (OLED) via the light emission control transistor T6.

A gate electrode G2 of the switching transistor T2 is connected with the gate line 151. The source electrode S2 of the switching transistor T2 is connected to the data line 171. The drain electrode D2 of the switching transistor T2 is connected to the source electrode S1 of the driving transistor T1 and is connected to the driving voltage line 172 via the operation control transistor T5.

The gate electrode G3 of the compensation transistor T3 is connected to the gate line 151. The source electrode S3 of the compensation transistor T3 is connected to the drain electrode D1 of the driving transistor T1 and is connected to the anode of the organic light emitting diode (OLED) via the light emission control transistor T6. The drain electrode D3 of the compensation transistor T3 is connected to the drain electrode D4 of the initialization transistor T4, one end Cst1 of the storage capacitor Cst, and the gate electrode G1 of the driving transistor T1 together.

The gate electrode G4 of the initialization transistor T4 is connected to the previous gate line 152. The source electrode S4 of the initialization transistor T4 is connected to the initialization voltage line 192. The drain electrode D4 of the initialization transistor T4 is connected to one end Cst1 of the storage capacitor Cst and the gate electrode G1 of the driving transistor T1, together, through the drain electrode D3 of the compensation transistor T3.

The gate electrode G5 of the operation control transistor T5 is connected to the light emission control line 153. The source electrode S5 of the operation control transistor T5 is connected to the driving voltage line 172. The drain electrode D5 of the operation control transistor T5 is connected to the source electrode S1 of the driving transistor T1 and the drain electrode D2 of the switching transistor T2

The gate electrode G6 of the light emission control transistor T6 is connected to the light emission control line 153. The source electrode S6 of the light emission control transistor T6 is connected to the drain electrode D1 of the driving transistor T1 and the source electrode S3 of the compensation transistor T3. The drain electrode D6 of the light emission control transistor T6 is connected to the anode of the organic light emitting diode (OLED).

The gate electrode G7 of the bypass transistor T7 is connected to the bypass control line 158. The source electrode S7 of the bypass transistor T7 is connected to the drain electrode D6 of the light emission control transistor T6 and the anode of the organic light emitting diode (OLED), together. The drain electrode D7 of the bypass transistor T7 is connected to the initialization voltage line 192 and the source electrode S4 of the initialization transistor T4, together.

The other end Cst2 of the storage capacitor Cst is connected to the driving voltage line 172. The cathode of the organic light emitting diode (OLED) is connected to a common voltage line 741 transmitting the common voltage ELVSS. The common voltage line 741 or the cathode may receive the common voltage ELVSS from the plurality of fourth signal lines 40 of the above-described fourth group 540a.

The circuit structure of the pixel PX is not limited to the particular structure shown in FIG. 6, and the number of transistors, the number of capacitors, and the connections therebetween may be changed.

Referring to FIG. 7, for example, a pixel area including a red pixel (R), a green pixel (G), and a blue pixel (B) is shown.

The gate line 151, the previous gate line 152, the light emission control line 153, and the bypass control line 158 respectively transmitting the gate signal Sn, the previous gate signal Sn−1, the light emission control signal EM, and the bypass signal BP may extend in substantially the first direction D1. The bypass control line 158 may be the same as the previous gate line 152. The data line 171 and the driving voltage line 172 respectively transmitting the data signal Dm and the driving voltage ELVDD may extend in substantially the second direction D2. The initialization voltage line 192 transmitting the initialization voltage Vint includes a transverse pan 192a that runs substantially parallel to the first direction D1 and an oblique part 192b that is oblique to the transverse part 192b.

The driving transistor T1, the switching transistor T2, the compensation transistor T3, the transistor T4, the operation control transistor T5, the light emission control transistor T6, the bypass transistor T7, the storage capacitor Cst, and the organic light emitting diode (OLED) are formed at the positions shown in FIG. 7.

The organic light emitting diode (OLED) includes a pixel electrode 191, an organic emission layer 370, and a common electrode 270. The compensation transistor T3 and the initialization transistor T4 may have a dual gate structure to prevent a leakage current.

Each channel of the driving transistor T1, the switching transistor T2, the compensation transistor T3, the initialization transistor T4, the operation control transistor T5, the light emission control transistor T6, and the bypass transistor T7 is disposed in one semiconductor 130. The semiconductor 130 may be bent into various shapes.

A cross-sectional structure of the display device will be described with reference to FIG. 7 and FIG. 8 while focusing on various transistors and the storage capacitor. It may therefore be assumed that any elements not described with respect to these figures are similar to or identical to corresponding elements previously described. FIG. 4 and FIG. 5 are also referred to for comparison with the cross-sectional structure in the bending region of the display device.

The display device includes the substrate 110 and the layers formed thereon. The substrate 110 may be a flexible substrate, for example, made of a polymer film. For example, the substrate 110 may be made of a plastic such as polyimide, polyamide, polyethylene terephthalate, polyethylene naphthalate, polyethylene ether ketone, polycarbonate, polyethylene sulfonate, polyarylate, etc.

A buffer layer 120 may be disposed on the substrate 110 to prevent diffusion of impurities and penetration of moisture, which may damage the semiconductors. The buffer layer 120 may include an inorganic material such as a silicon oxide (SiOx), a silicon nitride (SiNx), aluminum oxide (Al2O3), hafnium oxide (HfO3), yttrium oxide (Y2O3), etc. Even though the buffer layer 120 may be formed across an entire surface of the substrate 110, it might not be formed within the bending region BA. The buffer layer 120 may alternatively be disposed in the substrate 110, and for example, the substrate 110 may have a structure in which the polymer film and the buffer layer are alternately stacked.

The semiconductor 130 including a driving channel 131a, a switching channel 131b, and a light emission control channel 131f is disposed on the buffer layer 120. The semiconductor 130 may include a polysilicon, an oxide semiconductor, or amorphous silicon.

In the semiconductor 130, a driving source electrode 136a and a driving drain electrode 137a are formed on respective sides of the driving channel 131a. A switching source electrode 136b and a switching drain electrode 137b are formed on respective sides of the switching channel 131b. Also, a light emission control source electrode 136f and a light emission control drain electrode 137f are formed on respective sides of the light emission control channel 131f.

An insulating layer 141, that may be referred to as the first gate insulating layer, is disposed on the semiconductor 130. A first gate conductor including a gate line 151, a previous gate line 152, a light emission control line 153, a bypass control line 158, and a driving gate electrode (first storage electrode) 155a is disposed on the insulating layer 141. The gate line 151 may be in contact with a switching gate electrode 155b. The light emission control line 153 may be in contact with a light emission control gate electrode 155f. The first gate conductor may also include the first portion 61a of the first connection line 60a disposed in the first contact region CA1.

An insulating layer 142, that may be referred to as the second gate insulating layer, is disposed on the first gate conductor and the insulating layer 141. A second gate conductor, including a storage line 157 and a second storage electrode 156 as a part extended from the storage line 157, is disposed on the insulating layer 142. The second gate conductor also includes the first portion 61b of the second connection line 60b disposed in the first contact region CA1. The second storage electrode 156 forms the storage capacitor Cst along with the first storage electrode 155a. The first and second gate conductors may include a metal such as molybdenum (Mo), copper (Cu), aluminum (Al), silver (Ag), chromium (Cr), tantalum (Ta), titanium (Ti), or metal alloys thereof. The first and second gate conductors may be formed of multiple layers that are continuously deposited.

An insulating layer 160 that may be referred to as an interlayer insulating layer is disposed on the insulating layer 142 and the second gate conductor. The insulating layers 141, 142, and 160 may include the inorganic material such as a silicon oxide (SiOx) and/or a silicon nitride (SiNx). The insulating layers 141, 142, and 160 might not be disposed in the bending region BA. This is because the layer made of the inorganic material may be prone to cracking during the bending and the other layers may be damaged by the cracking.

The insulating layer 160 has contact holes 61, 62, 63, 64, 65, 66, and 67. In the first contact region CA1, the contact holes 69a and 69b are formed in the insulating layer 160. A first data conductor, including a data line 171, a first layer 172a of the driving voltage line 172, a driving connecting member 174, an initialization connecting member 175, and a pixel connecting member 179, is disposed on the insulating layer 160. The first data conductor also includes first layers 621a and 621b of second portions 62a and 62b of the first and second connection lines 60a and 60b disposed in the bending region BA and the first contact region CA1.

The data line 171 is connected to the switching source electrode 136b through the contact hole 62 formed in the insulating layers 141, 142, and 160. The driving connecting member 174 has one end connected to the first storage electrode 155a through the contact hole 61 formed in the insulating layers 142 and 160, and the other end connected to a compensation drain electrode and an initialization drain electrode through the contact hole 63 formed in the insulating layers 141, 142, and 160. The initialization connecting member 175 is connected to the initialization source electrode through the contact hole 64 formed in the insulating layers 141, 142, and 160. The pixel connecting member 179 is connected to the light emission control drain electrode 137f through the contact hole 66 formed in the insulating layers 141, 142, and 160. In the first contact region CA1, the first layer 621a of the second portion 62a of the first connection line 60a is connected to the first portion 61a of the first connection line 60a through the contact holes 69a formed in the insulating layers 142 and 160. The first layer 621b of the second portion 62b of the second connection line 60b is connected to the first portion 61b of the second connection line 60b through the contact holes 69b formed in the insulating layer 160.

An insulating layer 180a that may be referred to as a first protection layer is disposed on the first data conductor and the insulating layer 160. A second data conductor including a second layer 172b of the driving voltage line 172 is disposed on the insulating layer 180a. If the driving voltage line 172 is formed of a first conductor and a second conductor as two layers 172a and 172b, the resistance of the driving voltage line 172 is reduced such that a load effect may be reduced, and accordingly, a luminance difference on the light emission region of the display panel may be prevented. The second data conductor includes the second layers 622a and 622b of the second portions 62a and 62b of the first and second connection lines 60a and 60b disposed in the bending region BA and the first contact region CA1.

The first and second data conductors may include, for example, a metal such as copper (Cu), aluminum (Al), silver (Ag), molybdenum (Mo), chromium (Cr), gold (Au), platinum (Pt), palladium (Pd), tantalum (Ta), tungsten (W), titanium (Ti), nickel (Ni), or alloys thereof. For example, the first and second data conductors may include the aluminum-based metal having a small Young's modulus such as aluminum and aluminum alloys. In this case, the second portions 62a and 62b of the first and second connection lines 60a and 60b disposed in the bending region BA provide some stress against deformation, and for example, the risk of disconnection or degradation may be reduced although the second portions 62a and 62b are bent with a small curvature radius on the order of hundreds of micrometers. The first and second data conductors may be formed of multiple layers that are successively laminated, and for example, may have a three-layered structure such as titanium/aluminum/titanium, molybdenum/aluminum/molybdenum, or molybdenum/copper/molybdenum.

An insulating layer 180b that may be referred to as a second protection layer is disposed on the second conductor and insulating layer 180a. The insulating layers 180a and 180b may include the organic material. Alternatively, the second data conductor might not be disposed in the pixel area, and in this case, the insulating layer 180b might also not be disposed in the pixel area.

A pixel electrode 191 and an initialization voltage line 192 are disposed on the insulating layer 180b. The pixel connecting member 179 is connected to the pixel electrode 191 through a contact hole 81 formed in the insulating layers 180a and 180b. The initialization connecting member 175 is connected to the initialization voltage line 192 thorough the contact hole 82 formed in the insulating layers 180a and 180b. In the first contact region CA1, the second layers 622a and 622b of the second portions 62a and 62b of the first and second connection lines 60a and 60b are respectively connected to the first layers 621a and 621b of the second portions 62a and 62b through the contact holes 89 formed in the insulating layer 180a.

A pixel definition layer 350 is disposed on the insulating layer 180b, the initialization voltage line 192, and the edge off the pixel electrode 191. The pixel definition layer 350 has an opening 351 overlapping the pixel electrode 191. The pixel definition layer 350 may include an organic material such as a polyacrylate resin and a polyimide resin. Although not shown, the pixel definition layer 350 may be disposed on the insulating layer 180b in the bending region BA.

An organic emission layer 370 is disposed on the pixel electrode 191 and a common electrode 270 is disposed on the organic emission layer 370. The common electrode 270 may also be disposed on the pixel definition layer 350, and accordingly, the common electrode 270 may be formed throughout the plurality of pixels. The pixel electrode 191, the organic emission layer 370, and the common electrode 270 form the organic light emitting diode (OLED).

An encapsulation layer for protecting the organic light emitting diode (OLED) may be disposed on the common electrode 270. A polarization layer for reducing reflection of external light may be disposed on the encapsulation layer.

Figure 9:
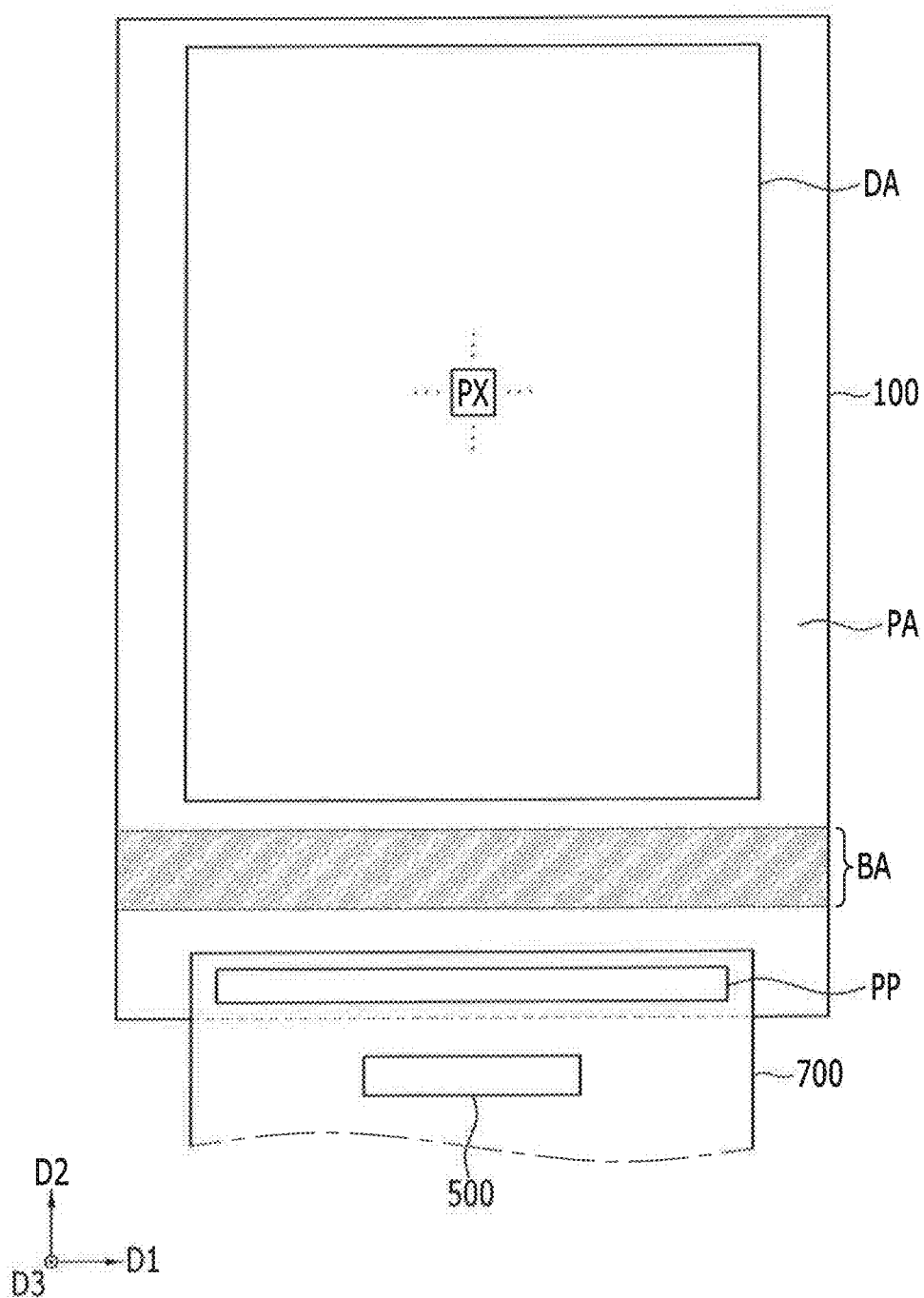
FIG. 9 is a layout view illustrating a display device, before bending a display panel included therein, according to an exemplary embodiment of the present invention.
Figure 10:
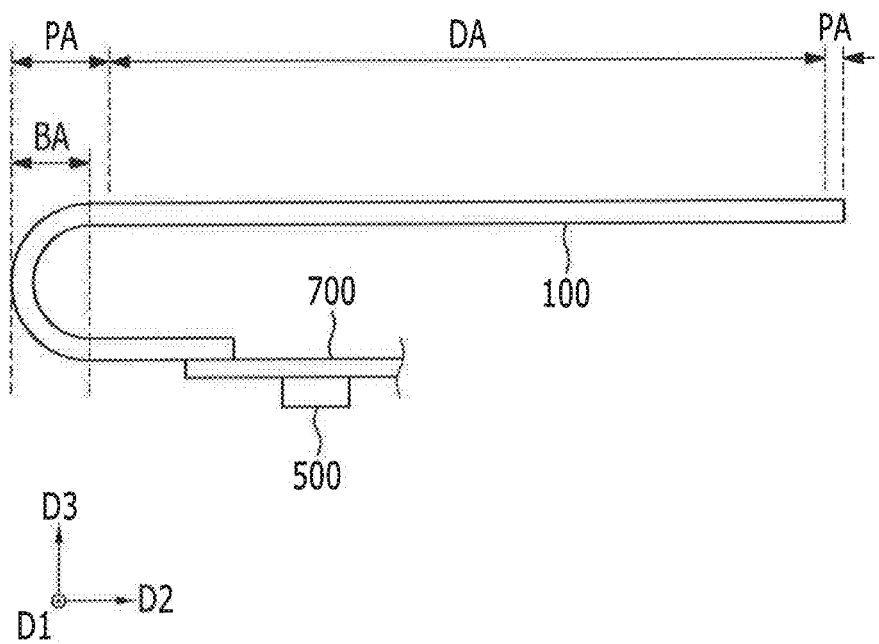
FIG. 10 is a lateral view illustrating a display device after, bending a display panel included therein, according to an exemplary embodiment of the present invention.

FIG. 9 is a layout view illustrating a display device before a display panel thereof is bent, according to an exemplary embodiment of the present invention. FIG. 10 is a lateral view illustrating a display device after bending.

Referring to FIG. 9, a printed circuit film 700 is attached to the pad portion PP of the display panel 100 described with reference to FIG. 1. A driving circuit chip 500 is mounted on one surface of the printed circuit film 700. The signals input to the pad portion PP through the printed circuit film 700 are transmitted to the elements of the display panel 100 through the signal lines, which extend across the bending region BA. Alternatively, the driving circuit chip 500 may be disposed between the bending region BA and the pad portion PP in the peripheral area PA.

Referring to FIG. 10, the display panel 100 is bent in the bending region BA with a predetermined curvature. As described above, by bending the display panel 100, the width of the peripheral area PA may appear to be reduced when viewed from the front (direction D3). This may give a device using the display panel, such as a smartphone, the appearance of a reduced bezel width. However, in actuality, by bending the display panel, the width of the peripheral area PA within the bending region BA is actually stretched, and accordingly, the distance between the pad portion PP and the display area DA is increased. Since the distance of the pad portion PP and the display area DA is increased, the length of the signal lines used to transmit the various signals from the pad portion PP to the display area DA are increased, and the increase of the length of the signal lines causes the resistance of the signal lines to increase. According to an exemplary embodiment of the present invention, as the parts of the signal lines disposed in the bending region BA include dual layers, having a material and shape that are suitable for bending, the resistance within the signal lines may be kept sufficiently small to maintain adequate image quality.

While exemplary embodiments of the present invention have been described with reference to the figures, it is to be understood that the invention is not limited to the disclosed embodiments, but, on the contrary, is intended to cover various modifications and equivalent arrangements.

What is claimed is:

1. A display device, comprising:
    a substrate including a display area, a bending area, and a first contact area between the display area and the bending area;
    a first wire including:
        a first part disposed in the first contact area,
        a second part extending across the contact area and the bending area, and
        a third part overlapping the second part;
    a first insulating layer disposed between the first part and the second part; and
    a second insulating layer disposed between the second part and the third part,
    wherein the second part of the first wire is connected to the first part of the first wire through a first contact hole in the first insulating layer, and the third part of the first wire is connected to the second part of the first wire through a second contact hole in the second insulating layer.

2. The display device of claim 1, wherein:
    the first contact hole and the second contact hole are disposed in the first contact area and spaced apart from each other in a plan view.

3. The display device of claim 1, wherein:
    the substrate further includes a pad area and a second contact area between the bending area and the pad area,
    the first wire further includes a fourth part disposed in the second contact area, and
    the second part of the first wire is connected to the fourth part of the first wire in the second contact area.

4. The display device of claim 3, wherein: the second part of the first wire is connected to the fourth part of the first wire through a contact hole in the first insulating layer.

5. The display device of claim 3, further comprising:
    a data line disposed in the display area; and
    a pad disposed in the pad area,
    wherein the first part of the first wire is connected with the data line and the fourth part of the first wire is connected to the pad.

6. The display device of claim 3, further comprising:
    a second wire including:
        a first part disposed in the first contact area,
        a second part extending across the contact area and the bending area, and
        a third part overlapping the second part;
    a third insulating layer disposed between the first part of the second wire and the first insulating layer,
    wherein the second part of the second wire is connected to the first part of the second wire through a third contact hole in the first and third insulating layers, and the third part of the second wire is connected to the second part of the second wire through a fourth contact hole in the second insulating layer.

7. The display device of claim 6, wherein: the third contact hole and the fourth contact hole are disposed in the first contact area and spaced apart from each other in a plan view.

8. The display device of claim 6, further comprising:
    a transistor disposed in the display area and including a gate electrode, source and drain electrode, and a semiconductor layer, and
    a fourth insulating layer disposed between the gate electrode and the semiconductor layer,
    wherein the second part of the first wire and the source and drain electrodes are disposed between the first insulating layer and the second insulating layer, and
    wherein the first part of the first wire and the gate electrode are disposed between the third insulating layer and the fourth insulating layer.

9. The display device of claim 8, further comprising:
    a fifth insulating layer disposed on the third part of the first wire; and
    a pixel electrode disposed on the fifth insulating layer and connected to one of the source and drain electrodes.

10. The display device of claim 9, further comprising:
    a driving voltage line disposed in the display area,
    wherein the third part of the first wire and the driving voltage line are disposed between the second insulating layer and the fifth insulating layer.

11. A display device, comprising:
    a substrate including a display area and a peripheral area disposed around the display area, the peripheral area including a bending region and a contact region adjacent to the bending region;
    a first connection line including:
        a first portion disposed in the contact region, and
        a second portion including a first layer and a second layer overlapping the first layer, wherein the first layer is disposed in both the contact region and the bending region, the second layer is disposed in both the contact region and the bending region, or each of the first layer and the second layer is disposed in both the contact region and the bending region; and a first insulating layer disposed between the first layer of the second portion and the second layer of the second portion, wherein, in the contact region, the first layer of the second portion is connected to the first portion, and the second layer of the second portion is connected to the first layer of the second portion through a contact hole disposed in the insulating layer.

12. The display device of claim 11, wherein: the first layer extends across both the contact region and the bending region, the second layer extends across both the contact region and the bending region, or each of the first and second layers extends across both the contact region and the bending region.

13. The display device of claim 11, wherein: each of the first and second layers extends across both the contact region and the bending region.

14. The display device of claim 11, further comprising:
a second connection line adjacent to the first connection line, extending across the bending region and the contact region, and including:
  a first portion disposed in the contact region, and
  a second portion including a first layer and a second layer overlapping the first layer; and
a second insulating layer disposed between the first portion of the second connection line and the second portion of the second connection line,
wherein, in the contact region, the first layer of the second portion of the second connection line is connected to the first portion of the second connection line through a contact hole in the second insulating layer.

15. The display device of claim 14, further comprising:
a third insulating layer disposed between the first portion of the first connection line and the first portion of the second connection line,
wherein, in the contact region, the first layer of the second portion of the first connection line is connected to the first portion of the first connection line through a contact hole in the second and third insulating layers.

16. A display device, comprising:
a substrate including a display area and a peripheral area disposed around the display area, the peripheral area including a bending region and a contact region adjacent to the bending region;
a first connection line including:
  a first portion disposed in the contact region, and
  a second portion including a first layer and a second layer disposed on the first layer, wherein the first layer is disposed in both the contact region and the bending region, the second layer is disposed in both the contact region and the bending region, or each of the first layer and the second layer is disposed in both the contact region and the bending region;
a first insulating layer disposed between the first portion and the first layer of the second portion; and
a second insulating layer disposed between the first layer of the second portion and the second layer of the second portion,
wherein, in the contact region, the first layer of the second portion is connected to the first portion through a contact hole disposed in the first insulating layer, and the second layer of the second portion is connected to the first layer of the second portion through a contact hole disposed in the second insulating layer.

17. The display device of claim 16, wherein: the first layer extends across both the contact region and the bending region, the second layer extends across both the contact region and the bending region, or each of the first and second layers extends across both the contact region and the bending region.

18. The display device of claim 16, wherein: each of the first and second layers extend across both the contact region and the bending region.

19. A display device, comprising:
a substrate including a display area and a non-display area, the non-display area including a bending region and a contact region between the display area and the bending region; and
a connection line, for driving the display device, connected to the display area and running across the bending region of the non-display area,
wherein the connection line, within at least the contact region of the non-display area, includes a first layer and a second layer in contact with each other at a plurality of contact points, and separated from each other by an insulation layer,
wherein the second layer at least partially overlaps the first layer and the plurality of contact points are disposed within a corresponding plurality of contact holes disposed within the insulation layer.

20. The display device of claim 19, wherein: the first layer runs across the bending region of the non-display area, the second layer runs across the bending region of the non-display area, or each of the first and second layers runs across the bending region of the non-display area.

* * * * *